US008018043B2

(12) United States Patent
Suh et al.

(10) Patent No.: US 8,018,043 B2
(45) Date of Patent: Sep. 13, 2011

(54) SEMICONDUCTOR PACKAGE HAVING SIDE WALLS AND METHOD FOR MANUFACTURING THE SAME

(75) Inventors: Min Suk Suh, Seoul (KR); Seung Taek Yang, Seoul (KR); Seung Hyun Lee, Gyeonggi-do (KR); Jong Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 243 days.

(21) Appl. No.: 12/261,112

(22) Filed: Oct. 30, 2008

(65) Prior Publication Data

US 2009/0224392 A1 Sep. 10, 2009

(30) Foreign Application Priority Data

Mar. 10, 2008 (KR) ........................ 10-2008-0021983
Aug. 29, 2008 (KR) ........................ 10-2008-0085386

(51) Int. Cl.
*H01L 23/48* (2006.01)
(52) U.S. Cl. ........ 257/690; 257/734; 257/773; 257/796; 257/E23.01; 257/E23.178; 257/E23.193
(58) Field of Classification Search .................. 257/690, 257/734, 773, 776, 782, 796, E23.01, E23.178, 257/E23.193, E21.499
See application file for complete search history.

(56) References Cited

U.S. PATENT DOCUMENTS

| 6,154,366 | A | * | 11/2000 | Ma et al. | ........................ 361/704 |
| 6,791,195 | B2 | | 9/2004 | Urushima | |
| 7,238,602 | B2 | | 7/2007 | Yang | |
| 7,675,157 | B2 | * | 3/2010 | Liu et al. | ........................ 257/690 |

FOREIGN PATENT DOCUMENTS

| JP | 2004-165189 A | 6/2004 |
| JP | 2006-203079 A | 8/2006 |
| KR | 1020030046791 A | 6/2003 |
| KR | 1020040030560 A | 4/2004 |
| KR | 100618892 B1 | 8/2006 |

* cited by examiner

*Primary Examiner* — Jasmine J Clark
(74) *Attorney, Agent, or Firm* — Ladas & Parry LLP

(57) ABSTRACT

A semiconductor package includes a semiconductor chip having an upper surface, side surfaces connected with the upper surface, and bonding pads formed on the upper surface. A first insulation layer pattern is formed to cover the upper surface and the side surfaces of the semiconductor chip and expose the bonding pads. Re-distribution lines are placed on the first insulation layer pattern and include first re-distribution line parts and second re-distribution line parts. The first re-distribution line parts have an end connected with the bonding pads and correspond to the upper surface of the semiconductor chip and the second re-distribution line parts extend from the first re-distribution line parts beyond the side surfaces of the semiconductor chip. A second insulation layer pattern is formed over the semiconductor chip and exposes portions of the first re-distribution line parts and the second re-distribution line parts.

9 Claims, 15 Drawing Sheets

SEMICONDUCTOR PACKAGE HAVING SIDE WALLS AND METHOD FOR MANUFACTURING THE SAME

CROSS-REFERENCE TO RELATED APPLICATIONS

The present application claims priorities to Korean patent application numbers 10-2008-0021983 filed on Mar. 10, 2008 and 10-2008-0085386 filed on Aug. 29, 2008, which are incorporated herein by reference in their entireties.

BACKGROUND OF THE INVENTION

The present invention relates generally to a semiconductor package and a method for manufacturing the same, and more particularly to a semiconductor package having side walls formed around a semiconductor chip to increase the bonding area of the semiconductor chip package.

Semiconductor chips capable of storing large amounts of data and processing the data rapidly and semiconductor packages utilizing such semiconductor chips have been developed. Chip scale packages that are no more than about 100% to 105% of the size of semiconductor chips have been disclosed in the art.

One such chip scale package is a wafer level package, which includes a semiconductor chip, bonding pads formed on the semiconductor chip, re-distribution lines connected with the bonding pads, and solder balls placed on the re-distribution lines. In the wafer level package above, the size of the semiconductor package considerably decreases, because the solder balls are placed on the semiconductor chip. The solder balls are attached to the re-distribution lines and placed on the semiconductor chip according to the international standard of Joint Electron Device Engineering Council (JEDEC).

As semiconductor chip manufacturing processes continue to evolve, the size of the semiconductor chip gradually decreases. Therefore, problems associated with the decrease in the size of the semiconductor chip, in that it is difficult to attach solder balls on the semiconductor chip according to the international standard of JEDEC.

SUMMARY OF THE INVENTION

Embodiments of the present invention include a semiconductor package which provides areas for placing solder balls even when the size of a semiconductor chip decreases.

Also, embodiments of the present invention include a method for manufacturing the semiconductor package.

In one embodiment of the present invention, a wafer level semiconductor package comprises a semiconductor chip having an upper surface, side surfaces which are connected with the upper surface, and bonding pads which are placed on the upper surface; a first insulation layer pattern covering the upper surface and the side surfaces and exposing the bonding pads; re-distribution lines placed on the first insulation layer pattern and having first re-distribution line parts which have one ends connected with the bonding pads and correspond to the upper surface of the semiconductor chip and second re-distribution line parts which extend from the first re-distribution line parts outside the side surfaces of the semiconductor chip; and a second insulation layer pattern exposing portions of the first re-distribution line parts and the second re-distribution line parts.

An upper surface of the first insulation layer pattern is parallel to the upper surface of the semiconductor chip, and side surfaces of the first insulation layer pattern are parallel to the side surfaces of the semiconductor chip.

The first insulation layer pattern comprises an organic layer pattern containing organic substance.

The wafer level semiconductor package further comprises connection members electrically connected with the exposed portions of the first re-distribution line parts and the second re-distribution line parts.

The semiconductor chip further has fuse boxes, which are insulated by the first insulation layer pattern.

In another embodiment of the present invention, a wafer level semiconductor package comprises a semiconductor chip having an upper surface, side surfaces which are connected with the upper surface, and bonding pads which are placed on the upper surface; a first insulation layer pattern placed along the side surfaces of the semiconductor chip; re-distribution lines placed on the semiconductor chip and having first re-distribution line parts which are connected with the bonding pads and second re-distribution line parts which extend from the first re-distribution line parts over the first insulation layer pattern; and a second insulation layer pattern exposing portions of the first re-distribution line parts and the second re-distribution line parts.

A thickness of the first insulation layer pattern is substantially the same as that of the semiconductor chip, and an upper surface of the first insulation layer pattern is positioned on substantially the same plane as the upper surface of the semiconductor chip.

The first insulation layer pattern comprises an organic layer pattern containing organic substance.

The wafer level semiconductor package further comprises connection members electrically connected with the exposed portions of the first re-distribution line parts and the second re-distribution line parts.

In another embodiment of the present invention, a method for manufacturing a wafer level semiconductor package comprises the steps of placing at least two semiconductor chips having bonding pads on a carrier substrate; forming a first insulation layer pattern on the carrier substrate to cover upper surfaces of the semiconductor chips and side surfaces of the semiconductor chips which are connected with the upper surfaces and to expose the bonding pads; forming re-distribution lines on the first insulation layer pattern, the re-distribution lines having first re-distribution line parts which are connected with the bonding pads and second re-distribution line parts which extend from the first re-distribution line parts outside the side surfaces of the semiconductor chips; forming a second insulation layer pattern on the first insulation layer pattern to expose portions of the first re-distribution line parts and the second re-distribution line parts; and individualizing the respective semiconductor chips.

The step of placing the semiconductor chips comprises the steps of inspecting semiconductor chips formed on a wafer and sorting good semiconductor chips and bad semiconductor chips; individualizing the good and bad semiconductor chips from the wafer; and placing the good semiconductor chips on the carrier substrate.

The step of forming the first insulation layer pattern on the carrier substrate comprises the steps of applying a flowable insulation material on the carrier substrate and thereby forming a first insulation layer to cover the semiconductor chips; baking the first insulation layer; and patterning the first insulation layer to define openings for exposing the bonding pads and to expose a portion of the carrier substrate between the semiconductor chips.

The step of forming the first insulation layer pattern on the carrier substrate comprises the steps of applying a flowable insulation material on the carrier substrate and thereby forming a first insulation layer to cover the semiconductor chips; baking the first insulation layer; and patterning the first insulation layer to define openings for exposing the bonding pads.

The method further comprises the step of placing connection members on the exposed portions of the first re-distribution line parts and the second re-distribution line parts.

The connection members comprise solder balls containing solder.

Before the step of individualizing the semiconductor chips, the method further comprises the step of separating the carrier substrate from the semiconductor chips.

In still another aspect of the present invention, a semiconductor package comprises a semiconductor chip having bonding pads; a chip receiving body having side walls and a bottom plate which is coupled with the side walls to define a receiving space for receiving the semiconductor chip; and re-distribution lines having first ends which are electrically connected with the bonding pads and second ends which face away from the first ends and extend over upper surfaces of the side walls of the chip receiving body.

The semiconductor package further comprises a solder resist pattern having openings for exposing portions of the re-distribution lines.

The openings expose portions of first re-distribution line parts of the re-distribution lines, which correspond to an upper surface of the semiconductor chip, and portions of second re-distribution line parts of the re-distribution lines, which correspond to the upper surfaces of the side walls.

The semiconductor package further comprises connection members electrically connected with the exposed portions of the first re-distribution line parts and the second re-distribution line parts.

Side surfaces of the bottom plate contact inner surfaces of the side walls.

The bottom plate and the side walls are made of any one of metal and synthetic resin.

The semiconductor package further comprises an adhesive member interposed between the semiconductor chip and the bottom plate.

The semiconductor package further comprises an insulation layer having openings for exposing the bonding pads which are formed on the upper surface of the semiconductor chip.

A total thickness of the bottom plate, the semiconductor chip and the insulation layer is the same as a height of the side walls.

At least two semiconductor chips are located on the bottom plate in the receiving space in the form of a matrix.

At least two semiconductor chips are the same kind of semiconductor chips.

At least two semiconductor chips are different kinds of semiconductor chips.

Bonding pads of at least two semiconductor chips are electrically connected with each other by the re-distribution lines.

At least two semiconductor chips are stacked on the bottom plate in the receiving space and are electrically connected with each other by through-electrodes which are electrically connected with re-distribution lines.

The semiconductor chips are the same kind of semiconductor chips.

The semiconductor chips are different kinds of semiconductor chips.

In yet another embodiment of the present invention, a method for manufacturing a semiconductor package comprises the steps of forming partition walls on a bottom plate in the form of lattices and thereby defining receiving spaces; placing good semiconductor chips having bonding pads, in the respective receiving spaces; forming re-distribution lines having first ends which are electrically connected with the bonding pads and second ends which face away from the first ends and extend over the partition walls; and cutting the partition walls and the bottom plate to individualize the semiconductor chips.

After the step of forming the re-distribution lines, the method further comprises the step of forming a solder resist pattern to cover the partition walls and the semiconductor chips and have openings for exposing portions of the re-distribution lines.

The bottom plate has the shape of a disc.

Before the step of forming the partition walls, the method further comprises the step of defining through-holes in partition wall forming regions on the bottom plate by a pressing process.

The bottom plate and the partition walls are made of any one of metal and synthetic resin.

The step of placing the good semiconductor chips on the bottom plate comprises the step of forming an adhesive member on at least one of the semiconductor chips and the bottom plate.

Before the step of forming the re-distribution lines, the method further comprises the steps of applying a flowable insulation material on the semiconductor chips and thereby forming an insulation layer which covers the semiconductor chips; and patterning the insulation layer and thereby exposing the bonding pads.

In the step of placing the semiconductor chips in the respective receiving spaces defined by the partition walls, at least two semiconductor chips are located on the bottom plate in each receiving space in the form of a matrix.

The semiconductor chips are the same kind of semiconductor chips or different kinds of semiconductor chips.

In the step of placing the semiconductor chips in the respective receiving spaces defined by the partition walls, at least two semiconductor chips are sequentially stacked on the bottom plate in each receiving space and are electrically connected with each other by through-electrodes.

The semiconductor chips are the same kind of semiconductor chips or different kinds of semiconductor chips.

In the step of placing the semiconductor chips in the respective receiving spaces defined by the partition walls, a semiconductor chip module including a plurality of stacked semiconductor chips, which are electrically connected with one another by through-electrodes, is placed in each receiving space.

DESCRIPTION OF SPECIFIC EMBODIMENTS

Figure 1:
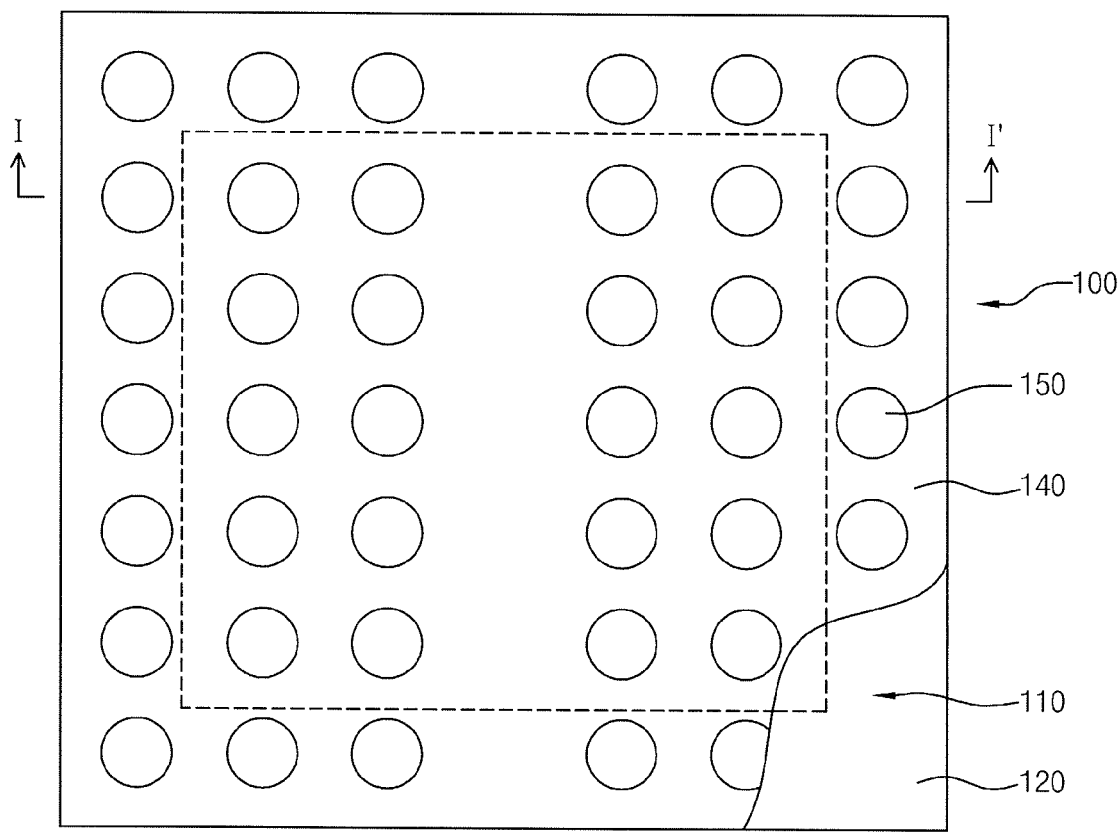
FIG. 1 is a plan view showing a wafer level semiconductor package in accordance with one embodiment of the present invention.
Figure 2:
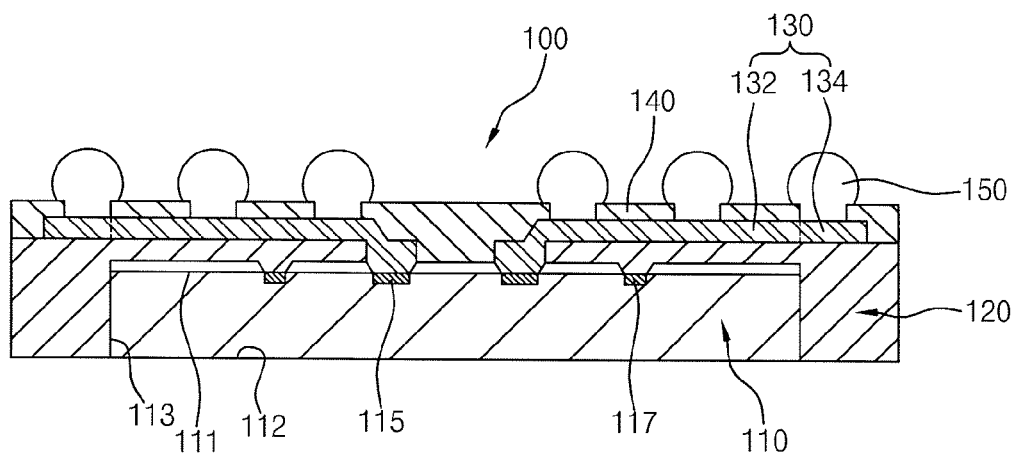
FIG. 2 is a cross-sectional view taken along the line I-I' of FIG. 1.

FIG. 1 is a plan view showing a semiconductor package in accordance with one embodiment of the present invention. FIG. 2 is a cross-sectional view taken along the line I-I' of FIG. 1.

Referring to FIGS. 1 and 2, a semiconductor package 100 includes a semiconductor chip 110, a first insulation layer pattern 120, re-distribution lines 130, and a second insulation layer pattern 140. In addition, the semiconductor package 100 may further include connection members 150 containing, for example, a solder.

According to an embodiment of the present invention, the semiconductor chip 110 may have the shape of a rectangular hexahedron, although it should be understood that the semiconductor chip 110 may also have any number of other various shapes.

The semiconductor chip 110 having the shape of a rectangular hexahedron includes an upper surface 111, a lower surface 112 facing away from the upper surface 111, and side surfaces 113 connecting the upper surface 111 and the lower surface 112.

The semiconductor chip 110 may further include a circuit section (not shown) and bonding pads 115. In addition, the semiconductor chip 110 may further include fuse boxes 117.

The circuit section (not shown) includes a data storage part for storing data and a data processing part for processing the data.

The bonding pads 115 are electrically connected with the circuit section. The bonding pads 115 receive data input to the circuit section from external devices and output data from the circuit section to the external devices. By way of example, signals inputted to the bonding pads may include power supply signals, control signals, address signals, and data signals.

The fuse boxes 117 function to repair the circuit section.

The first insulation layer pattern 120 is formed over the upper surface 111 and the side surfaces 113 of the semiconductor chip 110. For example, as shown in FIG. 2, an upper surface of the first insulation layer pattern 120 may include an upper surface, which is parallel to the upper surface 111 of the semiconductor chip 110, and side surfaces, which are parallel to the side surfaces 113 of the semiconductor chip 110. The first insulation layer pattern 120 includes first openings corresponding to the bonding pads 115, which expose the bonding pads 115.

The first insulation layer pattern 120 may comprise, an organic layer containing an organic substance. Alternatively, the first insulation layer pattern 120 may comprise an inorganic layer containing an inorganic substance.

In the present embodiment, the first insulation layer pattern 120, which covers the upper surface 111 and the side surfaces 113 of the semiconductor chip 110, increases the area for locating the connection members 150 electrically connected with the re-distribution lines 130 as will be described below. As a result, the size of the semiconductor chip 110 can be reduced while allowing the connection members 150 to be located according to the international standard of JEDEC.

The re-distribution lines 130 are formed on the upper surface of the first insulation layer pattern 120. In the present embodiment, each re-distribution line 130 has a first re-distribution line part 132 and a second re-distribution line part 134. An end of the first re-distribution line part 132 is electrically connected with the bonding pad 115, and the second re-distribution line part 134 extends from the opposite end of the first re-distribution line part 132 over the upper surface of the first insulation layer pattern 120 along an edge thereof, the edge corresponding to the side surface 113 of the semiconductor chip 110.

The re-distribution lines 130 may be formed of a conductive material, for example, copper. When the re-distribution lines 130 are formed of copper, the re-distribution lines 130 may include metal seed patterns, which have substantially the same shape as the re-distribution lines 130.

The second insulation layer pattern 140 is formed over the first insulation layer pattern 120. The second insulation layer pattern 140 may comprise an organic layer containing an organic substance. Alternatively, the second insulation layer pattern 140 may comprise an inorganic layer containing an inorganic substance.

The second insulation layer pattern 140 includes openings exposing portions of the first re-distribution line parts 132 and portions of the second re-distribution line parts 134. In the present embodiment, the openings are located according to the international standard of JEDEC.

The connection members 150 are electrically connected with the first re-distribution line parts 132 and the second re-distribution line parts 134, which are exposed through the openings defined in the second insulation layer pattern 140. The connection members 150 may comprise solder balls containing solder.

Figure 3:
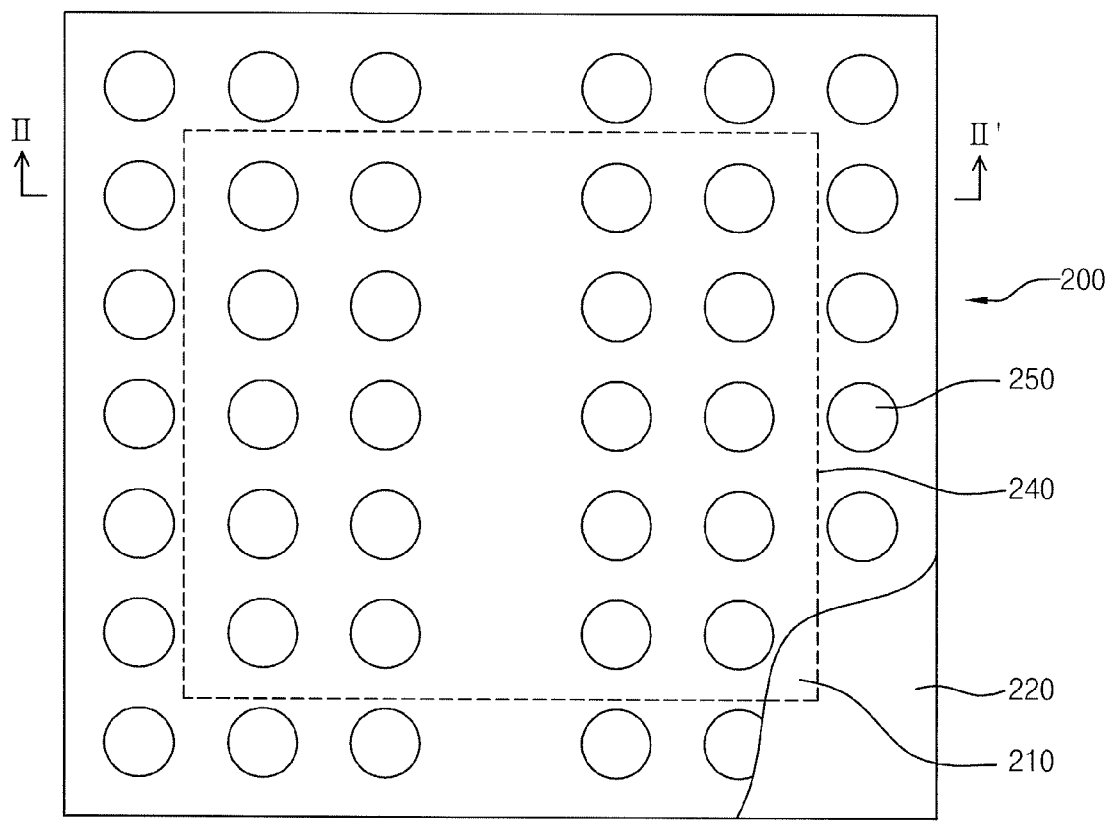
FIG. 3 is a plan view showing a wafer level semiconductor package in accordance with another embodiment of the present invention.
Figure 4:
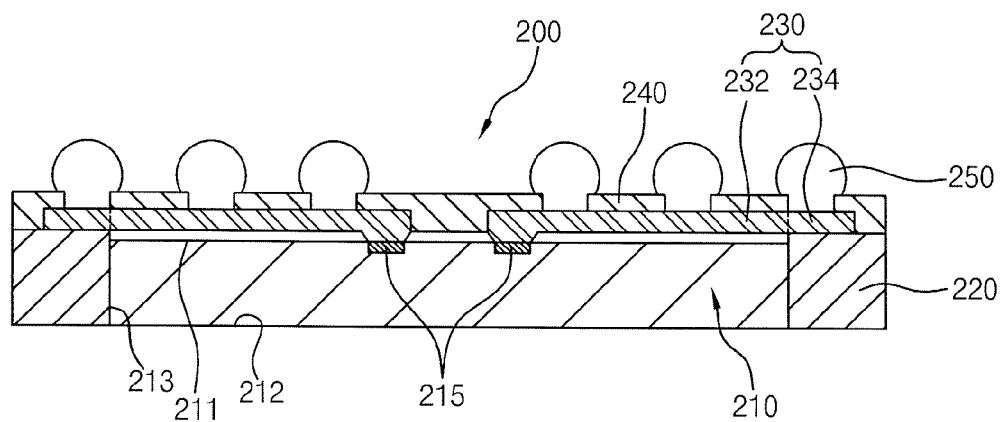
FIG. 4 is a cross-sectional view taken along the line II-II' of FIG. 3.

FIG. 3 is a plan view of a semiconductor package in accordance with another embodiment of the present invention. FIG. 4 is a cross-sectional view of the semiconductor package of FIG. 3, taken along the line II-II' of FIG. 3.

Referring to FIGS. 3 and 4, a semiconductor package 200 includes a semiconductor chip 210, a first insulation layer pattern 220, re-distribution lines 230, and a second insulation layer pattern 240. In addition, the semiconductor package 200 may include connection members 250 containing solder.

The semiconductor package 200 according to the present embodiment can be applied to a semiconductor chip that does not include a fuse box.

The semiconductor chip 210 may have the shape of, for example, a rectangular hexahedron, although it should be understood that the semiconductor chip 210 may have any number of other various shapes.

The semiconductor chip 210 includes an upper surface 211, a lower surface 212 facing away from the upper surface 211, and side surfaces 213 which connect the upper surface 211 and the lower surface 212.

Also, the semiconductor chip 210 may include a circuit section (not shown) and bonding pads 215.

The circuit section includes a data storage part for storing data and a data processing part for processing data.

The bonding pads 215 are electrically connected with the circuit section. The bonding pads 215 function to input data from external devices to the circuit section or output data from the circuit section to the external devices. Signals that may be input to the bonding pads 215 include, but are not limited to, power supply signals, control signals, address signals, and data signals. In the present embodiment, the bonding pads 215 can, for example, be formed on a central portion of the upper surface 211 of the semiconductor chip 210.

The first insulation layer pattern 220 is formed along the side surfaces 213 of the semiconductor chip 210. The first insulation layer pattern 220 formed along the side surfaces 213 of the semiconductor chip 210 may, for example, may be formed in the shape of a band. In the present embodiment, the first insulation layer pattern 220 is not formed on the upper surface 211 of the semiconductor chip 210, but rather only along the side surfaces 213 of the semiconductor chip as shown in FIG. 4.

The first insulation layer pattern 220 includes an upper surface which is, for example, parallel to the upper surface 211 of the semiconductor chip 210. The thickness of the first insulation layer pattern 220 is substantially the same as that of the semiconductor chip 210.

In the present embodiment, the first insulation layer pattern 220 may comprise, for example, an organic layer containing an organic substance. Alternatively, the first insulation layer pattern 220 may comprise an inorganic layer containing an inorganic substance. As yet another alternative, the first insulation layer pattern 220 may be formed of insulating synthetic resin or the like.

In the present embodiment, the first insulation layer pattern 220, which is formed along the side surfaces 213 and covers the side surfaces 213 of the semiconductor chip 210, increases the area available for locating the connection members 250 electrically connected with the re-distribution lines 230, as will be described below, allowing the connection members 250 to be located according to the international standard of JEDEC.

The re-distribution lines 230 are placed on the upper surface 211 of the semiconductor chip 210 and the upper surface of the first insulation layer pattern 220. In the present embodiment, each re-distribution line 230 has a first re-distribution line part 232 and a second re-distribution line part 234. A first end of the first re-distribution line part 232 is electrically connected with the bonding pad 215, and the second re-distribution line part 234 extends from the opposite end of the first re-distribution line part 232 over the upper surface of the first insulation layer pattern 220, which corresponds to the outside of the side surface 213 of the semiconductor chip 210.

The re-distribution lines 230 are formed of a conductive material, for example, copper. When the re-distribution lines 230 are formed of copper, the re-distribution lines 230 may include metal seed patterns having substantially the same shape as the re-distribution lines 230.

The second insulation layer pattern 240 is formed over both the semiconductor chip 210 and the first insulation layer pattern 220. The second insulation layer pattern 240 may comprise an organic layer containing an organic substance. Alternatively, the second insulation layer pattern 240 may comprise an inorganic layer containing an inorganic substance.

The second insulation layer pattern 240 includes openings defined therein which expose portions of the first and second parts 232, 234 of the re-distribution lines 230.

The connection members 250 are electrically connected with portions of the first re-distribution line parts 232 and portions of the second re-distribution line parts 234 which are exposed through the openings defined in the second insulation layer pattern 240. For example, the connection members 250 may comprise solder balls containing solder.

Figure 5:
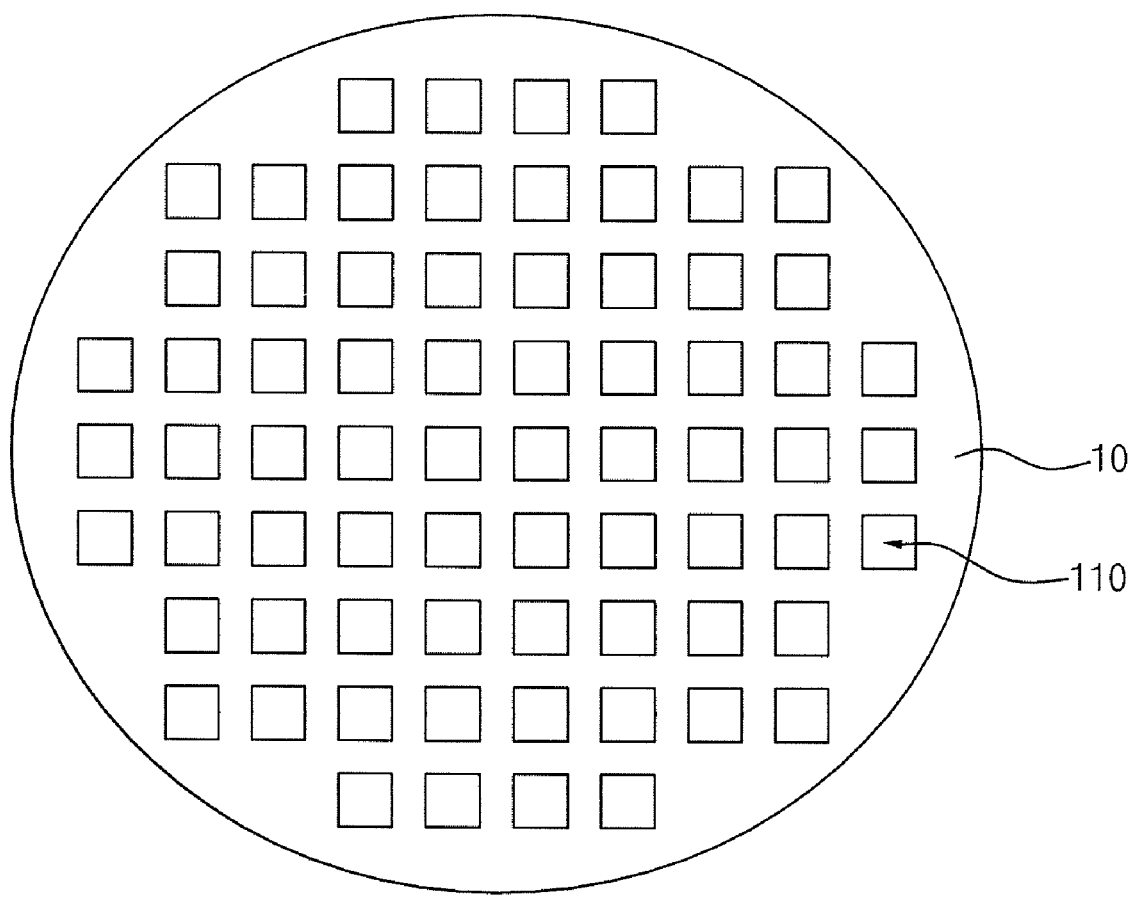
FIGS. 5 through 7 are cross-sectional views showing a method for manufacturing the wafer level semiconductor package in accordance with one embodiment of the present invention.
Figure 6:
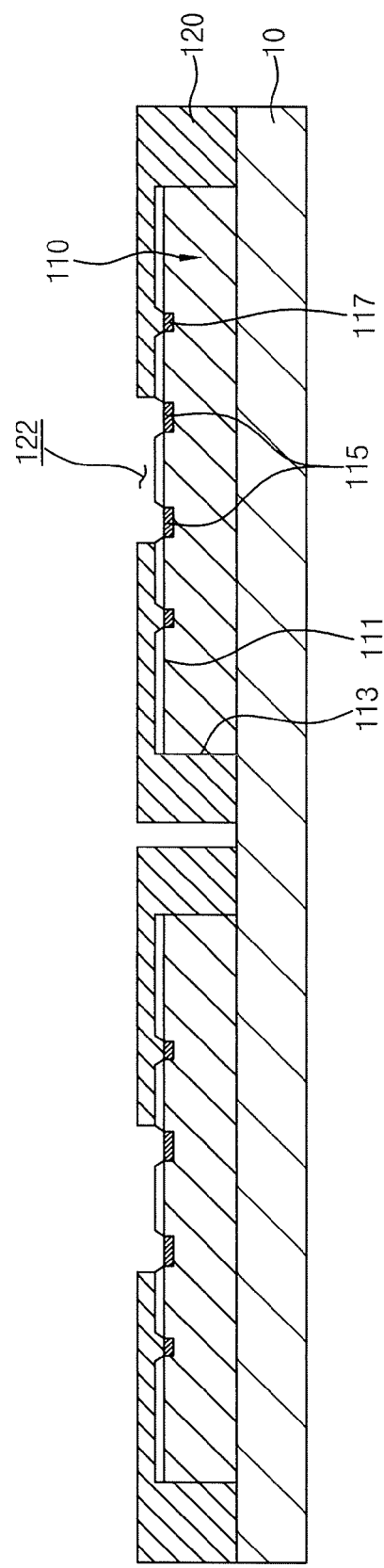
Figure 7:
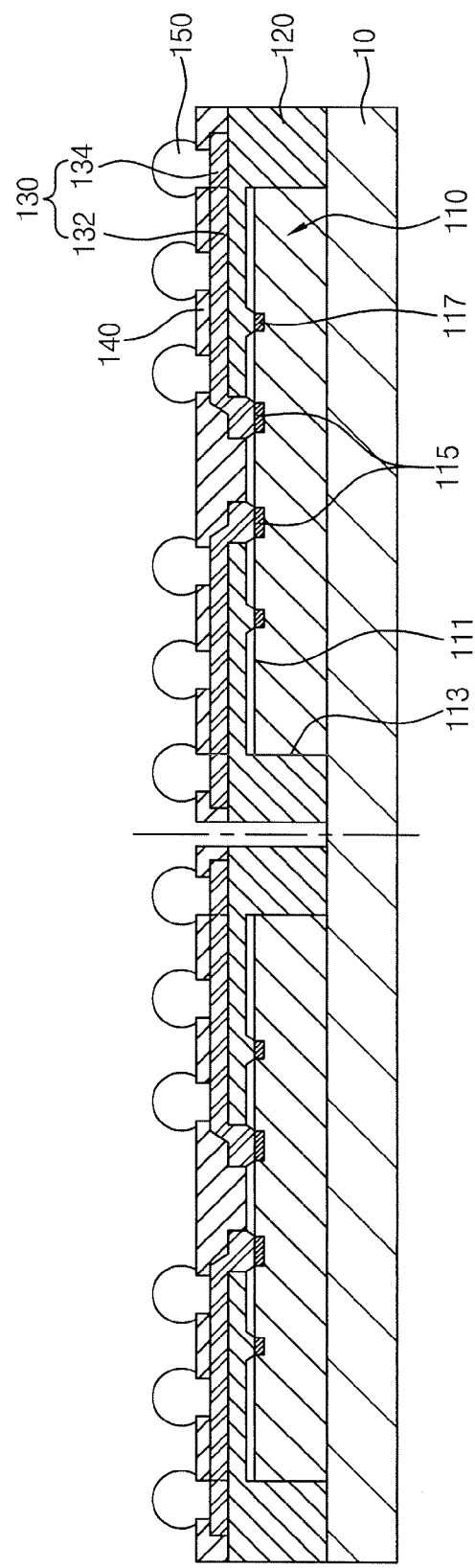

FIGS. 5 through 7 are a plan view and cross-sectional views illustrating a method for manufacturing the semiconductor package in accordance with one embodiment of the present invention.

Referring to FIG. 5, in the manufacture a semiconductor package, the step of locating or placing a plurality of semiconductor chips 110 on a carrier substrate 10 is implemented. In the present embodiment, the carrier substrate 10 may comprise, for example, a dummy wafer.

The semiconductor chips 110 can include circuit sections (not shown and bonding pads 115, which are electrically connected with the circuit sections. The semiconductor chips 110 may further include fuse boxes 117, which are electrically connected with the circuit sections.

In order to locate or place the semiconductor chips 110 on the carrier substrate 10, a plurality of semiconductor chips, which are formed on a wafer (not shown), are inspected through an electric die sorting (EDS) process, such that that it may be determined which semiconductor chips are good semiconductor chips and which are bad semiconductor chips, that is, determining which semiconductor chips have sufficiently high quality for a given application. Subsequently, the semiconductor chips are individualized from the wafer through a sawing process. Then, the good semiconductor chips are located or placed on the carrier substrate 10 using a die pick-up device, etc. At this time, the semiconductor chips 110 sorted as having good quality can be located on the carrier substrate 10 in such a way as to adjoin one another.

Referring to FIG. 6, after locating the semiconductor chips 110 sorted as having good quality on the carrier substrate 10, a first insulation layer (not shown) is formed on the carrier substrate to cover the semiconductor chips 110 sorted as having good quality by applying a flowable insulation material on the carrier substrate 10.

According to an embodiment of the present invention, the first insulation layer may include a photosensitive substance. However, it should be understood that the first insulation layer may also be formed of another material. Then, the flowable insulation material covering the carrier substrate 10 is baked to form the first insulation layer, which covers the carrier substrate 10.

The baked first insulation layer is patterned through a patterning process that includes a lithographic process and a development process. Through the patterning process, a first insulation layer pattern 120 is formed to have openings 122 that expose the bonding pads 115 of the semiconductor chips 110 and also expose portions of the carrier substrate 10 between the semiconductor chips 110.

Alternatively, the baked first insulation layer may be patterned through a patterning process including a lithographic process and a development process in a manner such that openings 122 for exposing only the bonding pads 115 of the semiconductor chips 110 are defined. That is, the first insulation layer pattern 120 is formed on upper surfaces 111 of the respective semiconductor chips 110 and is filled in between the semiconductor chips 110, by which the first insulation layer pattern 120 covers side surfaces 113 of the semiconductor chips 110. In the present embodiment, the upper surface of the first insulation layer pattern 120 becomes parallel to the upper surfaces 111 of the semiconductor chips 110.

Referring to FIG. 7, after the first insulation layer pattern 120 is formed on the carrier substrate 10, re-distribution lines 130 are formed over the carrier substrate 10.

In order to form the re-distribution lines 130, a metal seed layer (not shown) is formed on the first insulation layer pattern 120 and the bonding pads 115 which are exposed through the first insulation layer pattern 120. The metal seed layer can be formed, for example, through a sputtering process, and may be formed of a material such as titanium, nickel, vanadium, and copper.

After the metal seed layer is formed on the first insulation layer pattern 120, photoresist patterns (not shown), which have openings for forming the re-distribution lines 130, are formed on the metal seed layer.

After the photoresist patterns are formed, a plating process is conducted on the metal seed layer which is exposed through the openings defined in the photoresist patterns, whereby the re-distribution lines 130 are formed. In the present embodiment, each re-distribution line 130 includes a first re-distribution line part 132 and a second re-distribution line part 134. A first end of the first re-distribution line part 132 is electrically connected with the bonding pad 115, and the second re-distribution line part 134 extends from the opposite end of the first re-distribution line part 132 along a portion of the upper surface of the first insulation layer pattern 120 which corresponds to the outside of the side surface 113 of the semiconductor chip 110. The re-distribution lines 130 may be formed of a conductive material, for example, copper.

After the re-distribution lines 130 having first re-distribution line parts 132 and second re-distribution line parts 134 are formed, a second insulation layer pattern 140 is formed on the first insulation layer pattern 120.

The second insulation layer pattern 140 can comprise an organic layer containing an organic substance. The second insulation layer pattern 140 has openings corresponding to the first and second re-distribution line parts 132, 134 which expose the first re-distribution line parts 132 and the second re-distribution line parts 134.

Connection members 150 are electrically connected with the re-distribution lines 130 which are exposed through the openings defined in the second insulation layer pattern 140. Subsequently, the carrier substrate 10 is removed from the semiconductor chips 110, and the semiconductor chips 110 are individualized, and the individualized semiconductor chips may then be utilized in the manufacture of semiconductor packages.

In the present embodiment, the connection members 150 may be located outside the side surfaces 113 of the semiconductor chips 110. Due to this fact, the connection members 150 can be formed on the semiconductor chips 110 in accordance with the international standard of JEDEC, even when a semiconductor chip 110 has an area which is smaller than that prescribed in JEDEC as the international standard for the location of the connection members 150. That is, as the reduction of the size of semiconductor chips continues, the surface area of the semiconductor chip becomes too small to form connection members in accordance with the international standard of JEDEC. However, according to an embodiment of the present invention, connection members may be formed in accordance with the international standard of JEDEC even on such semiconductor chips.

Figure 8:
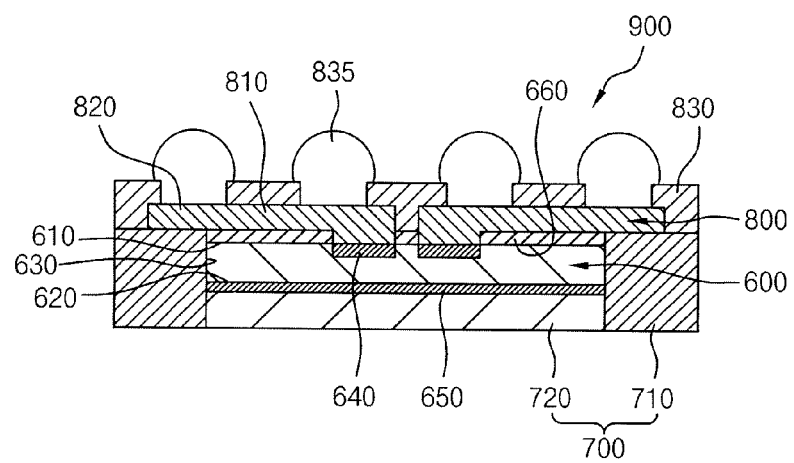
FIG. 8 is a cross-sectional view showing a semiconductor package in accordance with another embodiment of the present invention.

FIG. 8 is a cross-sectional view of a semiconductor package in accordance with another embodiment of the present invention.

Referring to FIG. 8, a semiconductor package 900 includes a semiconductor chip 600, a chip receiving body 700, and re-distribution lines 800.

The semiconductor chip 600 has the shape of, for example, a rectangular hexahedron although it should be understood that the semiconductor chip 600 may also have any number of other various shapes. The semiconductor chip 600 having the shape of a rectangular hexahedron has an upper surface 610, a lower surface 620 facing away from the upper surface 610, and side surfaces 630 connecting the upper surface 610 and the lower surface 620.

The semiconductor chip 600 includes a circuit section (not shown) and bonding pads 640.

The circuit section includes a data storage part (not shown) for storing data and a data processing part (not shown) for processing data.

The bonding pads 640 are located on the upper surface 610 of the semiconductor chip 600 and are electrically connected with the circuit section. According to an embodiment of the present invention, the bonding pads 640 may be formed on a central portion of the upper surface 610 of the semiconductor chip 600. Alternatively, the bonding pads 640 may be located along the edges of the upper surface 610 of the semiconductor chip 600.

The chip receiving body 700 includes side walls 710 and a bottom plate 720. The side walls 710 and the bottom plate 720 of the chip receiving body 700 define a space for receiving the semiconductor chip 600.

In the present embodiment, the bottom plate 720 has, for example, the shape of a rectangle which is substantially similar to the shape of the semiconductor chip 600. The side walls 710 are formed on the side surfaces of the bottom plate 720. In the present embodiment, the side surfaces of the bottom plate 720 contact the inner surfaces of the side walls 710, as shown in FIG. 8.

In the present embodiment, the side walls 710 and the bottom plate 720 may be made of any one of metal and synthetic resin. By way of example, the bottom plate 720 may comprise a metal, and the side walls 710 may comprise a synthetic resin. Alternatively, the bottom plate 720 may be made of synthetic resin, and the side walls 710 may be made of metal. As yet another alternative, both the side walls 710 and the bottom plate 720 may be made of synthetic resin, or both the side walls 710 and the bottom plate 720 may be made of metal.

In the present embodiment, the side walls 710 are made of synthetic resin, and the bottom plate 720 is made of metal. The bottom plate 720 comprises a metal which has excellent heat conductivity such as, copper, aluminum, silver, or the like.

In the present embodiment, the semiconductor chip 600 is secured in the chip receiving body 700 including the side walls 710 and the bottom plate 720, by an adhesive member 650 interposed between the bottom plate 720 and the lower surface 620 of the semiconductor chip 600. The adhesive member 650 can comprise, for example, epoxy resin or a double-sided adhesive tape. It should be understood that other means of adhesion may also be appropriate for securing the semiconductor chip 600 within the chip receiving body 700. The adhesive member 650 may be placed on the lower surface 620 of the semiconductor chip 600 or the upper surface of the bottom plate 720.

An insulation layer 660 is formed on the upper surface 610 of the semiconductor chip 600, which is received in the receiving space of the chip receiving body 700. The insulation layer 660 may comprise, for example, an organic layer. The insulation layer 660 includes openings exposing the bonding pads 640 formed on the upper surface 610 of the semiconductor chip 600. In the present embodiment, the insulation layer 660 is also formed on the upper surfaces of the side walls 710 when the side walls 710 are made of metal.

In the present embodiment, the total thickness of the bottom plate 720, the adhesive member 650, the semiconductor chip and the insulation layer 660 is substantially the same as the height of the side walls 710.

The re-distribution lines 800 have the shape of a line when viewed from above. An end of each re-distribution line 800 is electrically connected with a corresponding bonding pad 640, which is exposed through the opening of the insulation layer 660, and the opposite end of each re-distribution line 800 extends onto the upper surface of the side wall 710.

In the present embodiment, each re-distribution line includes a first and a second re-distribution line part 810, 820, the first re-distribution line part 810 being the portion of a re-distribution line 800 formed on the upper surface 610 of the semiconductor chip 600, and the second first re-distribution line part 820 being the portion of the re-distribution line 800 formed on the upper surface of the side wall 710.

The semiconductor package 900 according to the present embodiment may further include a solder resist pattern 830. The solder resist pattern 830 covers the upper surface of the resultant semiconductor chip 600 and the sidewalls 710 having the re-distribution lines 800 formed thereon. The solder resist pattern 830 includes a plurality of openings which expose, for example, portions of the first re-distribution line parts 810 and the second re-distribution line parts 820 of the re-distribution lines 800. The openings defined in the solder resist pattern 830 are located according to the international standard of JEDEC.

Connection members 835 comprising a low melting point metal, such as solder, are located on the portions of the first re-distribution line parts 810 and the second re-distribution line parts 820 which are exposed through the openings defined in the solder resist pattern 830. The connection members 835 are located according to the international standard of JEDEC.

Figure 9:
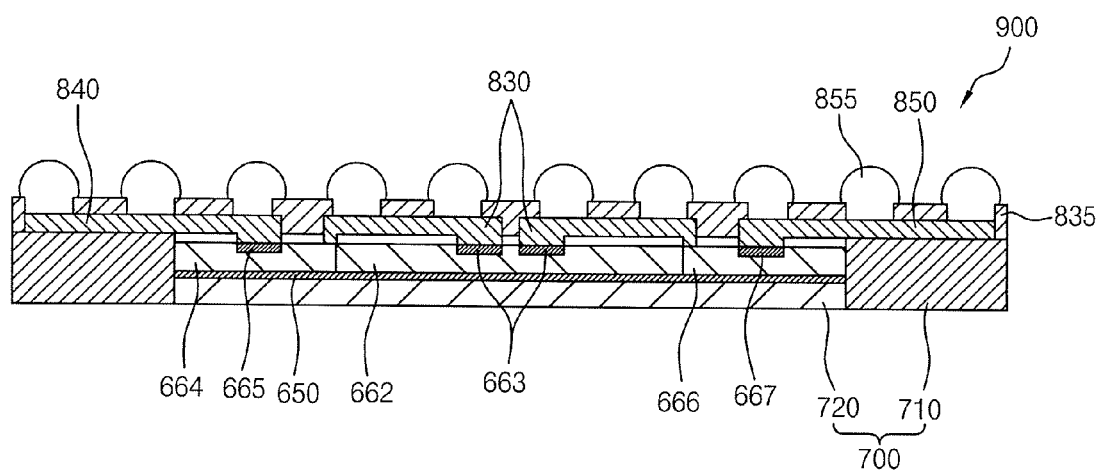
FIG. 9 is a cross-sectional view showing a semiconductor package in accordance with still another embodiment of the present invention.

FIG. 9 is a cross-sectional view showing a semiconductor package in accordance with still another embodiment of the present invention.

Referring to FIG. 9, a semiconductor package 900 includes semiconductor chips 662, 664, and 666, a chip receiving body 700, and re-distribution lines 830, 840, and 850.

The chip receiving body 700 includes side walls 710 and a bottom plate 720. The side walls 710 and the bottom plate 720 of the chip receiving body 700 define a space for receiving the semiconductor chips 662, 664, and 666.

In the present embodiment, the bottom plate 720 has the shape of a rectangle, although it should be understood that other the bottom plate 720 may also have any number of other various shapes. The side walls 710 are placed on the side surfaces of the bottom plate 720. In the present embodiment, the side surfaces of the bottom plate 720 contact the inner surfaces of the side walls 710.

In the present embodiment, the side walls 710 and the bottom plate 720 may be made of any one of metal and synthetic resin. For example, the bottom plate 720 may be made of metal, and the side walls 710 may be made of synthetic resin. Alternatively, the bottom plate 720 may be made of synthetic resin, and the side walls 710 may be made of metal. As yet another alternative, both the side walls 710 and the bottom plate 720 may be made of synthetic resin, or both of the side walls 710 and the bottom plate 720 may be made of metal.

In the present embodiment, the side walls 710 comprise a synthetic resin, and the bottom plate 720 comprises a metal. The bottom plate 720 is formed of a metal having excellent heat conductivity such as copper, aluminum, or silver.

In the present embodiment, in order to secure the semiconductor chips 662, 664, and 666 in the chip receiving body 700, an adhesive member 650 is interposed between the bottom plate 720 and the semiconductor chips 662, 664, and 666. By way of example, the adhesive member 650 may comprise epoxy resin or a double-sided adhesive tape. The adhesive member 650 may be placed on the lower surfaces of the semiconductor chips 662, 664 and 666 or alternatively the adhesive member 650 may be placed on the upper surface of the bottom plate 720.

The plurality of semiconductor chips 662, 664, and 666 are located on the bottom plate 720 of the chip receiving body 700. The plurality of semiconductor chips 662, 664, and 666 may be located on the bottom plate 720 in the form of a matrix. For example, the semiconductor chips 662, 664, and 666 may be located on the bottom plate 720 in the form of a 3×1 matrix, a 3×2 matrix, a 3×3 matrix, etc. In the present embodiment, the semiconductor chips 662, 664, and 666 are located in the form of a 3×1 matrix.

Hereinbelow, the middle semiconductor chip among the semiconductor chips 662, 664, and 666 located on the bottom plate 720, is defined as a first semiconductor chip 662, and the semiconductor chips, which are located on the sides of the first semiconductor chip 662 are defined as a second semiconductor chip 664 and a third semiconductor chip 666 respectively. The first semiconductor chip 662 has first bonding pads 663, the second semiconductor chip 664 has second bonding pads 665, and the third semiconductor chip 666 has third bonding pads 667.

In the present embodiment, the first through third semiconductor chips 662, 664, and 666 may be the same kind of semiconductor chips, or alternatively at least one of the first through third semiconductor chips 662, 664, and 666 may be a different kind of semiconductor chip. For example, the first semiconductor chip 662 may be a system semiconductor chip, and the second and third semiconductor chips 664 and 666 may be memory semiconductor chips.

Hereinbelow, first re-distribution lines 830 are electrically connected with the first bonding pads 663, second re-distribution lines 840 are electrically connected with the second bonding pads 665, and third re-distribution lines 850 are electrically connected with the third bonding pads 667.

The first re-distribution lines 830 extend to the upper surfaces of the second and third semiconductor chips 664 and 666, and the second and third re-distribution lines 840 and 850 extend to the upper surfaces of the side walls 710 of the chip receiving body 700.

A solder resist pattern 835 is formed on first through third re-distribution lines 830, 840, and 850. Openings are defined in the solder resist pattern 835 which expose portions of the first through third re-distribution lines 830, 840, and 850.

Connection members 855 are formed on the portions of the first through third re-distribution lines 830, 840, and 850 which are exposed through the openings defined in the solder resist pattern 835. The connection members 855 contain a low melting point metal such as solder.

Figure 10:
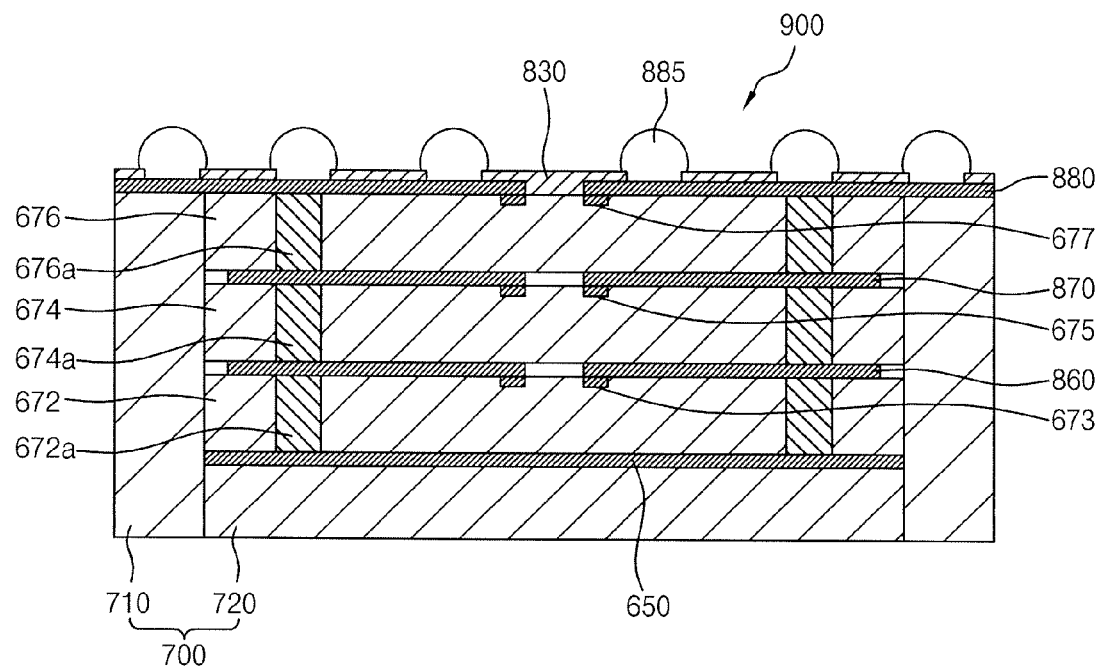
FIG. 10 is a cross-sectional view showing a semiconductor package in accordance with another embodiment of the present invention.

FIG. 10 is a cross-sectional view showing a semiconductor package in accordance with another embodiment of the present invention.

Referring to FIG. 10, a semiconductor package 900 includes semiconductor chips 672, 674, and 676, a chip receiving body 700, and re-distribution lines 860, 870, and 880. The semiconductor package 900 may further include a solder resist pattern 830 and connection members 885.

The chip receiving body 700 includes side walls 710 and a bottom plate 720.

The side walls 710 and the bottom plate 720 of the chip receiving body 700 define a space for receiving the semiconductor chips 672, 674 and 676.

In the present embodiment, the bottom plate 720 has, for example, the shape of a rectangle, although it should be understood that the bottom plate may alternatively have another shape. The side walls 710 are placed on the side surfaces of the bottom plate 720. In the present embodiment, the side surfaces of the bottom plate 720 contact, for example, the inner surfaces of the side walls 710.

In the present embodiment, the side walls 710 and the bottom plate 720 may be made of any one of metal and synthetic resin. For example, the bottom plate 720 may be made of metal, and the side walls 710 may be made of synthetic resin. Alternatively, the bottom plate 720 may be made of synthetic resin, and the side walls 710 may be made of metal. As yet another alternative, both the side walls 710 and the bottom plate 720 may be made of synthetic resin, or both the side walls 710 and the bottom plate 720 may be made of metal.

In the present embodiment, the side walls 710 and the bottom plate 720 are made of metal. The bottom plate 720 is formed of a material which has excellent heat conductivity, for example copper, aluminum, or silver.

In the present embodiment, in order to secure the semiconductor chip 672 in the chip receiving body 700 including the side walls 710 and the bottom plate 720, an adhesive member 650 is interposed between the bottom plate 720 and the semiconductor chip 672. The adhesive member 650 may comprise, for example, epoxy resin or a double-sided adhesive tape. The adhesive member 650 may be placed on the lower surface of the semiconductor chip 672 or the upper surface of the bottom plate 720.

The plurality of semiconductor chips 672, 674, and 676 are sequentially stacked on the bottom plate 720 of the chip receiving body 700. Hereinbelow, the semiconductor chips, which are stacked on the bottom plate 720, are respectively defined as first through third semiconductor chips 672, 674, and 676.

The first semiconductor chip 672 is placed on the adhesive member 650, the second semiconductor chip 674, is placed on the first semiconductor chip 672, and the third semiconductor chip 676 is placed on the second semiconductor chip 674.

The first semiconductor chip 672 has first bonding pads 673, the second semiconductor chip 674 has second bonding pads 675, and the third semiconductor chip 676 has third bonding pads 677.

The first semiconductor chip 672 has first through-electrodes 672a, the second semiconductor chip 674 has second through-electrodes 674a, and the third semiconductor chips 676 has third through-electrodes 676a. In the present embodiment, the first through third through-electrodes 672a, 674a, and 676a are located at substantially the same position, such that the first through third through electrodes 672a, 674a, and 676a are aligned in the vertical direction.

In the present embodiment, the first through third semiconductor chips 672, 674, and 676 may be the same kind of semiconductor chips. Alternatively, at least one of the first through third semiconductor chips 672, 674, and 676 may be a different kind of semiconductor chip. For example, the first semiconductor chip 672 may be a system semiconductor chip, and the second and third semiconductor chips 674 and 676 may be memory semiconductor chips.

Hereinbelow, first re-distribution lines 860 are electrically connected with both the first bonding pads 673 and the first through-electrodes 672a, second re-distribution lines 870 are electrically connected with both the second bonding pads 675 and the second through-electrodes 674a, and third re-distribution lines 880 are electrically connected with both the third bonding pads 677 and the third through-electrodes 676a.

According to the present embodiment, the first re-distribution lines 860 are electrically connected with the second through-electrodes 674a, and the second re-distribution lines 870 are electrically connected with the third through-electrodes 676a. Further, the third re-distribution lines 880 are formed to extend over the upper surfaces of the side walls 710 of the chip receiving body 700.

The solder resist pattern 830 is formed to cover the third re-distribution lines 880 which extend over the upper surfaces of the side walls 710. Openings are defined in the solder resist pattern 830 which expose portions of the third re-distribution lines 880.

Connection members 855 are electrically connected with the portions of the third re-distribution lines 880 which are exposed through the openings defined in the solder resist pattern 830. The connection members 855 are formed of a low melting point metal, for example solder.

The operation of semiconductor chips results in the generation of heat. For example, as the data processing speed of semiconductor chips in a semiconductor package increases, the amount of heat generated may be such that the semiconductor package fails to operate properly. In the present embodiment, a large amount of heat generated in the semiconductor chips stacked upon one another can be dissipated to the outside through the side walls 710 and the bottom plate 720 of the chip receiving body 700, such that the data processing speed of the semiconductor package 900 can be increased.

FIGS. 11 through 26 are plan views and cross-sectional views showing a method for manufacturing the semiconductor package in accordance with another embodiment of the present invention.

Figure 11:
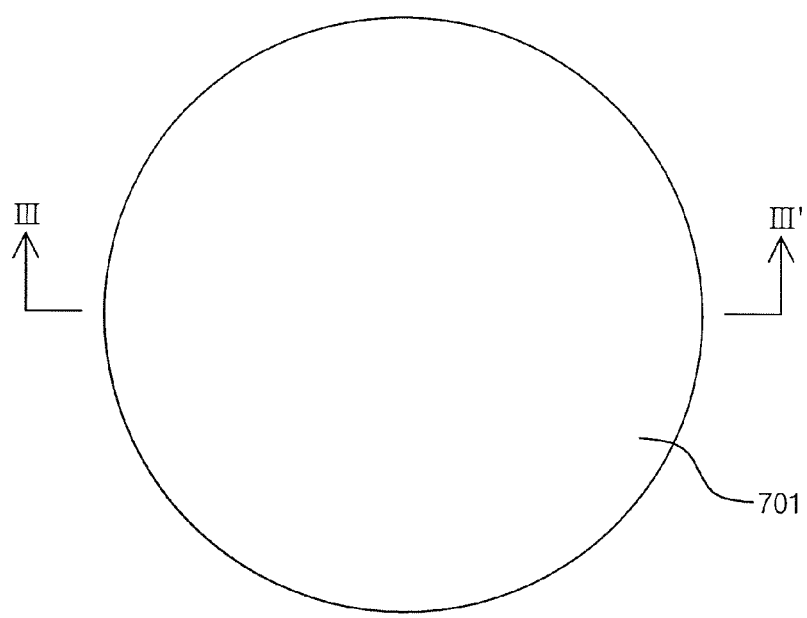
FIGS. 11 through 26 are plan views and cross-sectional views showing a method for manufacturing the semiconductor package in accordance with another embodiment of the present invention.
Figure 12:
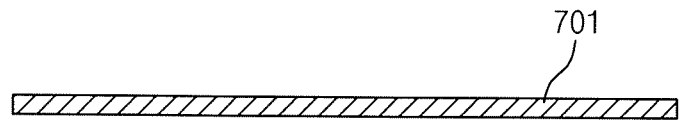

FIG. 11 is a plan view showing a bottom plate used for manufacturing semiconductor packages according to the present invention. FIG. 12 is a cross-sectional view taken along the line III-III' of FIG. 11.

Referring to FIGS. 11 and 12, in order to manufacture semiconductor packages, a bottom plate 701 is prepared. In the present embodiment, the bottom plate 701 has the shape of a disc when viewed from above. For example, the bottom plate 701 has the same shape as a wafer, or a circular disc. In the present embodiment, the bottom plate 701 is formed, for example, of a metal having excellent heat conductivity, such as aluminum, aluminum alloy, copper, or copper alloy. Alternatively, the bottom plate 701 may be formed of a synthetic resin.

Figure 13:
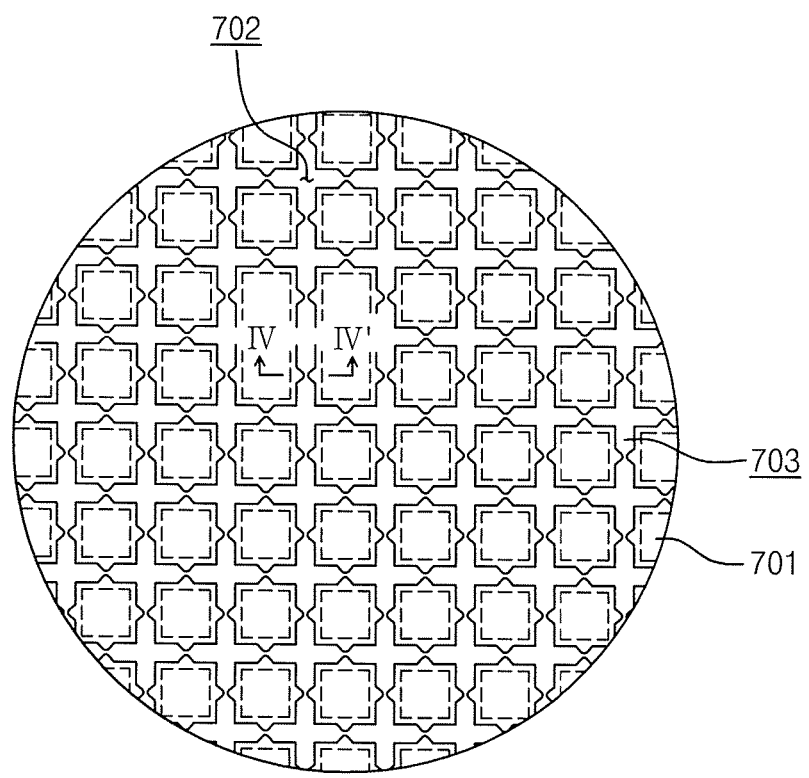
Figure 14:
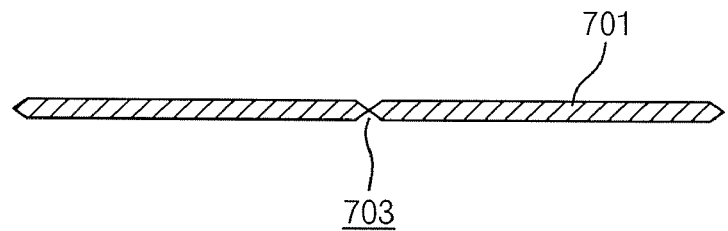

FIG. 13 is a plan view showing the defining of through-holes in the bottom plate shown in FIG. 11. FIG. 14 is a sectional view taken along the line IV-IV' of FIG. 13.

Referring to FIGS. 13 and 14, through-holes 703 are defined at regions 702 of the bottom plate 701 where partition walls are to be formed as will be described later, such that the through-holes 703 adjoin one another. The regions 702 are defined in the form of lattices on the bottom plate 701. The through-holes 703 adjoining one another can be defined in the bottom plate 701, for example, by conducting a pressing process in the regions 702. The through-holes 703 have the shape of slots when viewed from above.

Figure 15:
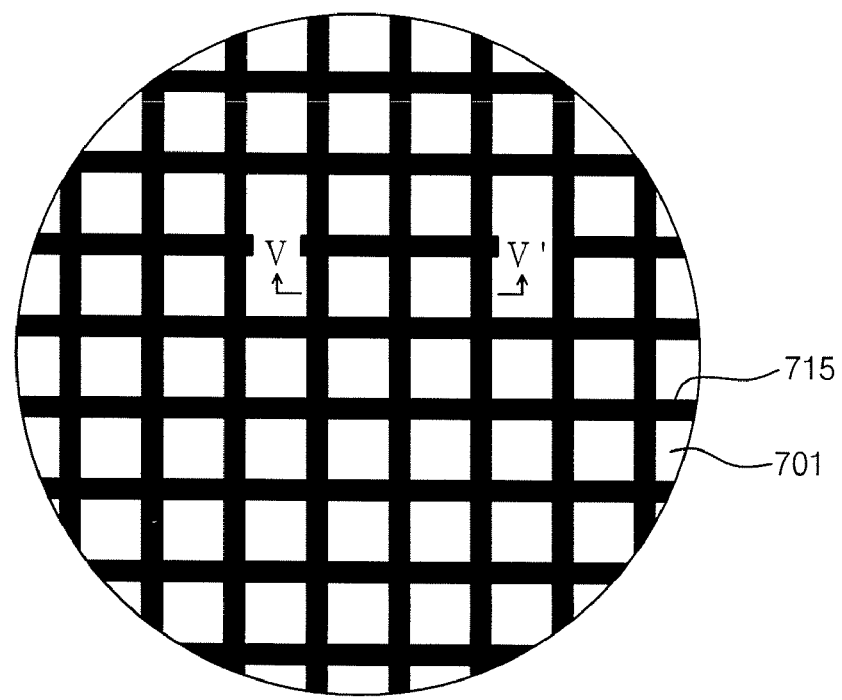
Figure 16:
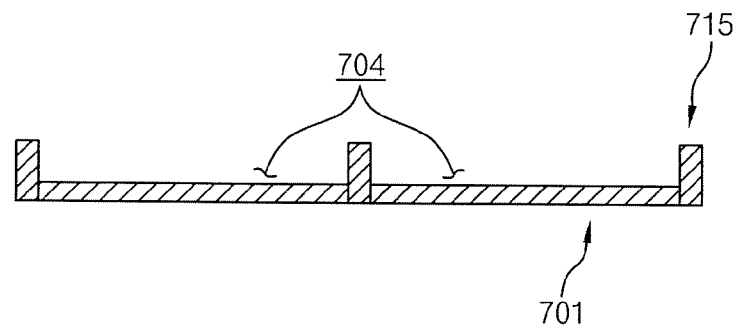

FIG. 15 is a plan view showing the formation of partition walls on the bottom plate shown in FIG. 13. FIG. 16 is a cross-sectional view taken along the line V-V' of FIG. 15.

Referring to FIGS. 15 and 16, after the through-holes 703 are defined in the bottom plate 701 as shown in FIG. 13, partition walls 715 are formed along the regions 702 shown in FIG. 13. Receiving spaces are defined on the bottom plate 701 by the partition walls 715 which are formed to have a predetermined height when measured from the upper surface of the bottom plate 701. In the present embodiment, the partition walls 715 may be formed by a process including, for example, pouring synthetic resin in molds. The partition walls 715 may be arranged in a lattice pattern when viewed from the top. The partition walls 715 pass through the bottom plate 701 due to the presence of the through-holes 703. Therefore, the side surfaces of the partition walls 715 contact the side surfaces of the bottom plate 701. Alternatively, the partition walls 715 may be formed by arranging metal plates, each having the shape of a rectangular hexahedron, into a lattice pattern within the through-holes 703.

A plurality of chip mounting regions 704 are defined on the bottom plate 701, by the partition walls 715 having the lattice pattern.

Figure 17:
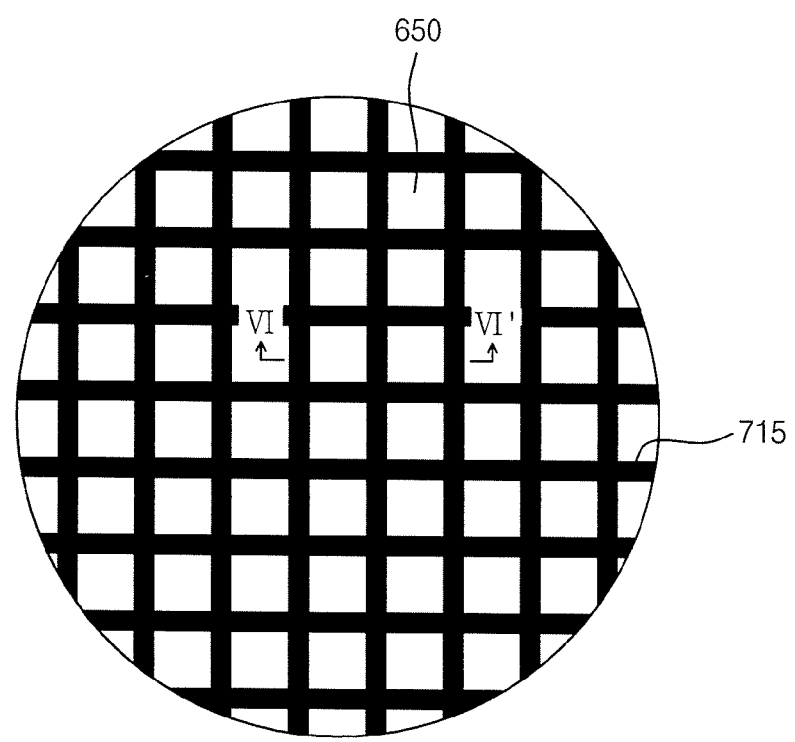
Figure 18:
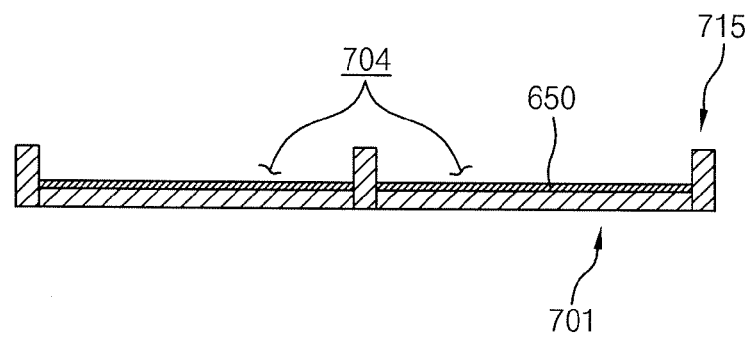

FIG. 17 is a plan view showing the formation of the adhesive members in the chip mounting regions shown in FIG. 15. FIG. 18 is a cross-sectional view taken along the line VI-VI' of FIG. 17.

Referring to FIGS. 17 and 18, after the partition walls 715 are formed on the bottom plate 701, adhesive members 650 are placed in the respective chip mounting regions 704, which are defined by the partition walls 715 on the bottom plate 701. The adhesive members 650 may comprise an adhesive tape or a flowable adhesive containing epoxy. Alternatively, the adhesive members 650 may be placed on the lower surfaces of semiconductor chips, which are subsequently placed in the respective chip mounting regions 704.

Figure 19:
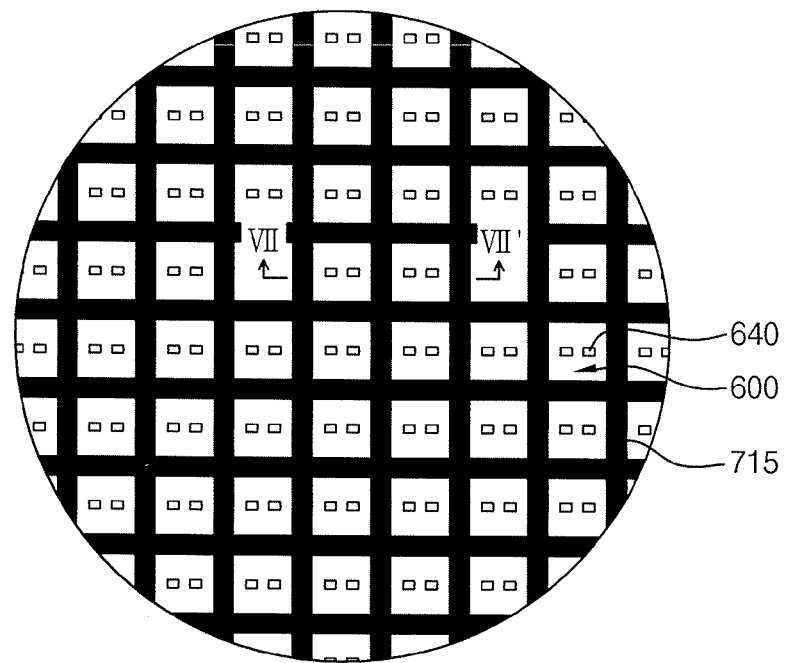

FIG. 19 is a plan view showing the locating of the semiconductor chips in the chip mounting regions shown in FIG. 18.

Figure 20:
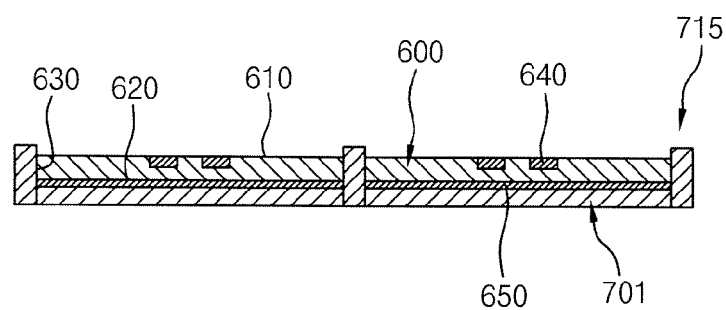

FIG. 20 is a cross-sectional view taken along the line VII-VII' of FIG. 19.

Referring to FIGS. 19 and 20, semiconductor chips 600 are located in the respective chip mounting regions 704 defined by the partition walls 715 and positioned on the bottom plate 701. Each semiconductor chip 600 has an upper surface 610, a lower surface 620 which faces away from the upper surface 610, and side surfaces 630 which connect the upper surface 610 and the lower surface 620. Each semiconductor chip 600 has the shape of, for example, a rectangular hexahedron, although it should be understood that a semiconductor chip may have any number of other shapes as well.

Bonding pads 640 are placed on the upper surface 610 of each semiconductor chip 600. By way of example, the bonding pads 640 may be placed on a central portion of the upper surface 610 of the semiconductor chip 600.

The lower surface 620 of each semiconductor chip 600 is placed on the bottom plate 701 and is bonded thereto by an adhesive member 650. In the present embodiment, the partition walls 715 extend above the upper surfaces 610 of the semiconductor chips 600 by a predetermined amount.

Figure 21:
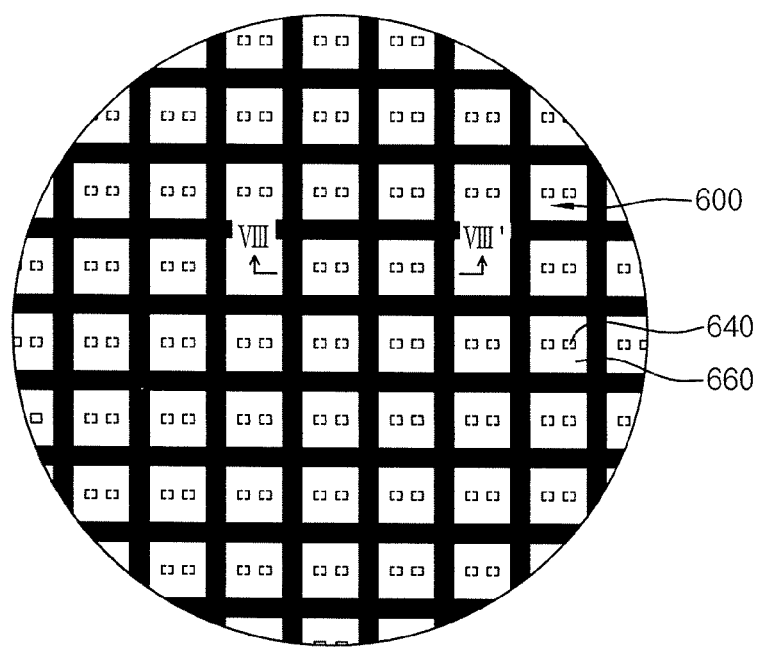
Figure 22:
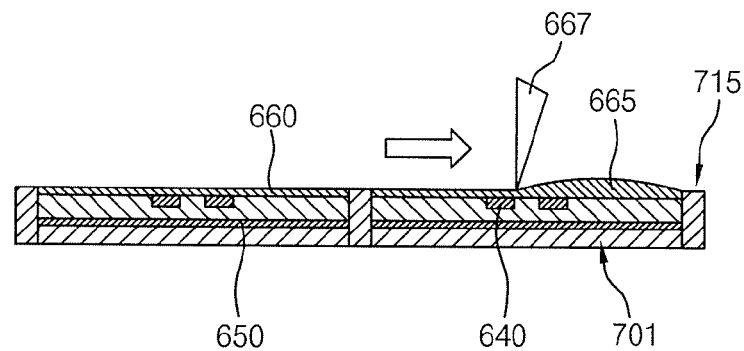

FIG. 21 is a plan view showing the formation of an insulation layer on the upper surfaces of the semiconductor chips shown in FIG. 19. FIG. 22 is a sectional view taken along the line VIII-VIII' of FIG. 21.

Referring to FIGS. 21 and 22, after the respective semiconductor chips 600 are attached to the adhesive members 650, an insulation material 650 is applied on the semiconductor chips 600, by which an insulation layer 660 for covering the upper surfaces 610 of the semiconductor chips 600 is formed.

In order to form the insulation layer 660, a flowable insulation material 665 is applied on the upper surfaces 610 of the semiconductor chips 600. Then the flowable insulation material 665 is uniformly spread by a scraper 667, so as to form an insulation layer 660 on the upper surfaces 610 of the semiconductor chips 600.

In the present embodiment, the total thickness of the bottom plate 701, the adhesive member 650, the semiconductor chip 600 and the insulation layer 660 are substantially the same as the height of the partition wall 715. As an alternative, in the present embodiment, the insulation layer 660 may be formed on the partition walls 715 in addition to the semiconductor chips 600.

Figure 23:
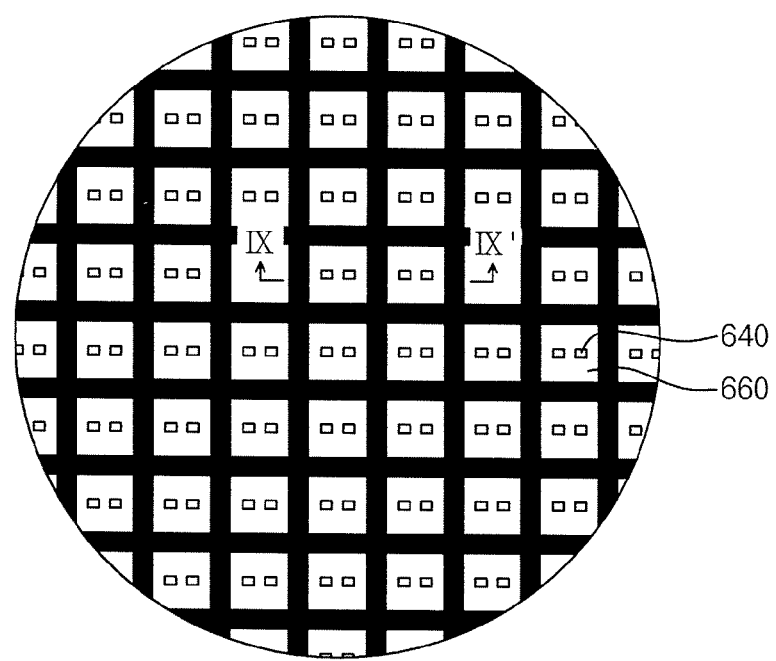
Figure 24:
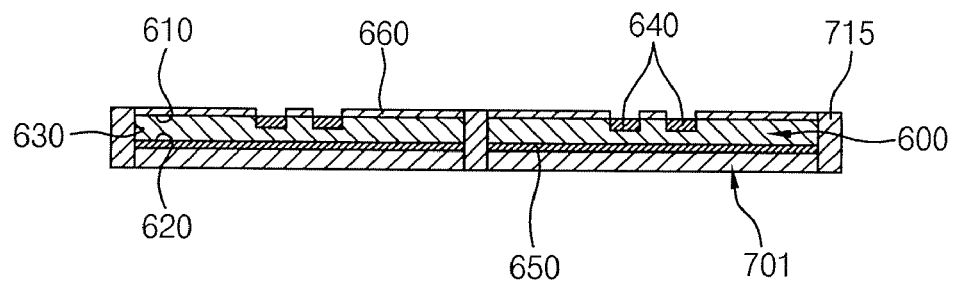

FIG. 23 is a plan view showing the patterning of the insulation layer shown in FIG. 21. FIG. 24 is a cross-sectional view taken along the line IX-IX' of FIG. 23.

Referring to FIGS. 23 and 24, openings exposing the bonding pads 640 are defined by patterning the insulation layer 660 formed on the semiconductor chips 600.

Figure 25:
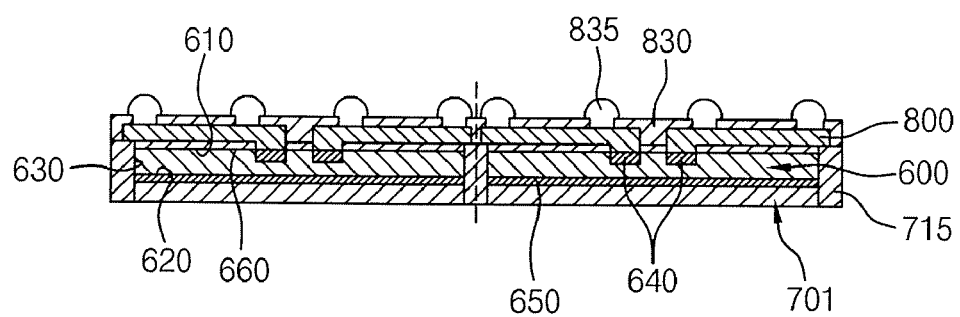

FIG. 25 is a cross-sectional view showing re-distribution lines, a solder resist pattern, and connection members, which are formed on the semiconductor chips shown in FIG. 24.

Referring to FIG. 25, re-distribution lines 800 are formed on the semiconductor chips 600 and the partition walls 715. In the present embodiment, an end of each re-distribution line 800 is electrically connected with a corresponding bonding pad 640 of the semiconductor chip 600, and the opposite end of each re-distribution line 800 extends partially or entirely over the upper surface of the partition wall 715.

A solder resist pattern 830 covers the upper surfaces 610 of the semiconductor chips 600 and the upper surfaces of the partition walls 715. Openings are defined by patterning the solder resist pattern 830. The openings expose first re-distribution line parts of the re-distribution lines 800, which correspond to the upper surfaces 610 of the semiconductor chips 600, and second re-distribution line parts of the re-distribution lines 800, which correspond to the upper surfaces of the partition walls 715.

After the solder resist pattern 830 is patterned and the openings are defined, connection members 835 are connected to portions of the first and second re-distribution line parts of the re-distribution lines 800, which are exposed through the openings defined in the solder resist pattern 830.

Figure 26:
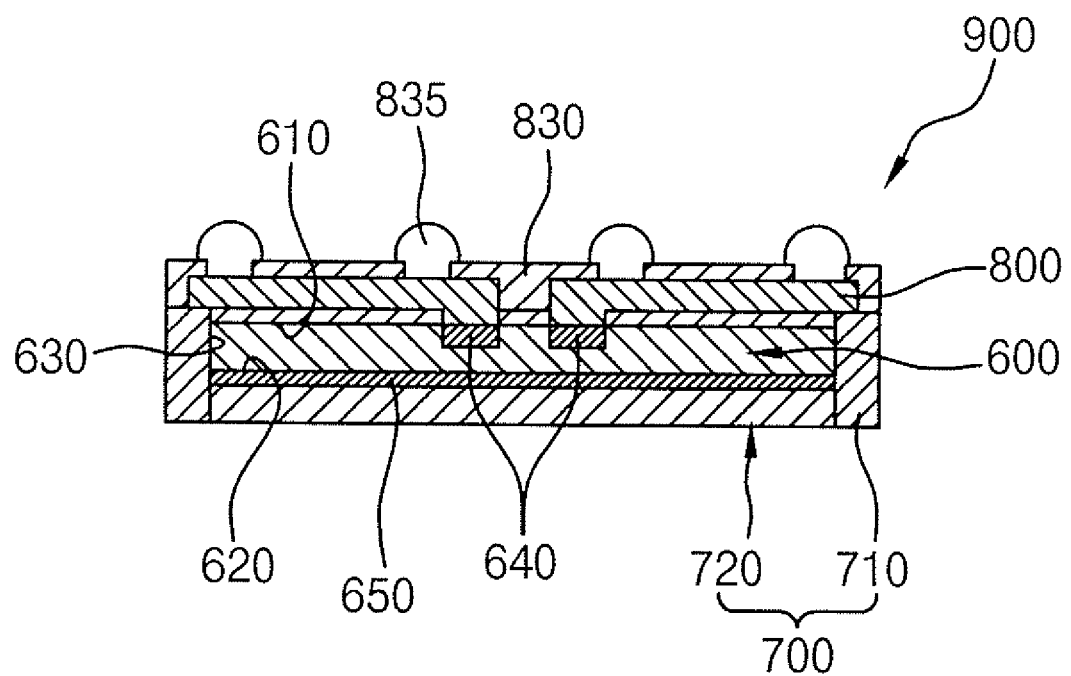

FIG. 26 is a cross-sectional view showing a semiconductor packages formed by cutting the partition walls shown in FIG. 25.

Referring to FIG. 26, after the connection members 835 are placed on the re-distribution lines 800 of the semiconductor chips 600, the partition walls 715 are cut, such that, semiconductor packages 900 each having side walls 710 and a bottom plate 720 are manufactured.

Although it was described in the method for manufacturing a semiconductor package according to the present embodiment that each semiconductor chip 600 is placed in a chip mounting region 704 defined by the partition walls 715, it should be readily understood that a plurality of semiconductor chips 662, 664, and 666 can be placed in a chip mounting region in the form of a matrix as shown in FIG. 9.

When the plurality of semiconductor chips 662, 664, and 666 are placed in each chip mounting region in the form of a matrix, the semiconductor chips 662, 664, and 666 may each be the same kind of semiconductor chips, or alternatively, the semiconductor chips 662, 664, and 666 may be different kinds of semiconductor chips.

Also, while it was described in the method for manufacturing a semiconductor package according to the present embodiment that each semiconductor chip 600 is placed in a chip mounting region 704 defined by the partition walls 715, it should be readily understood that a plurality of semiconductor chips 672, 674, and 676 may be stacked in a chip mounting region and be connected with one another by through-electrodes 672*a*, 674*a*, and 676*a* as shown in FIG. 10. When the plurality of semiconductor chips 672, 674, and 676 are stacked in a chip mounting region, the individual semiconductor chips may be sequentially stacked upon one another in the chip mounting region or a semiconductor chip module including a plurality of stacked semiconductor chips may be placed in the chip mounting region.

When the plurality of semiconductor chips 672, 674, and 676 are stacked in a chip mounting region, the semiconductor chips 672, 674, and 676 may be the same kind of semiconductor chips, or alternatively, the semiconductor chips 672, 674, and 676 may be different kinds of semiconductor chips.

As is apparent from the above description, in the present invention, as the size of semiconductor chips and semiconductor chip packages decreases, forming connection members according to the international standard of JEDEC becomes increasingly more difficult. According to the present invention, the connection members can be located according to the international standard of JEDEC by forming side walls which cover the side surfaces of the semiconductor chip. Also, according to the present invention the operational characteristics of the semiconductor chip can be improved, because by placing a bottom plate having excellent heat conductivity on the lower surface of the semiconductor chip, heat generated in the semiconductor chip can be rapidly dissipated to the outside.

Moreover, in the present invention, not only it is possible to satisfy the standard ball layout prescribed in JEDEC, but the number of the connection members in a semiconductor package, which are needed to process data with a high density at a high speed, can be increased.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A semiconductor package comprising:
   a semiconductor chip having bonding pads;
   a chip receiving body having side walls and a bottom plate coupled with the side walls, wherein side surfaces of the bottom plate contact inner side surfaces of the side walls, the coupled bottom plate and sidewalls defining a receiving space for receiving the semiconductor chip; and
   re-distribution lines having first ends electrically connected with the bonding pads and second ends facing away from the first ends and extending over and contacting upper surfaces of the side walls of the chip receiving body.

2. The semiconductor package according to claim 1, further comprising:
   a solder resist pattern having openings for exposing portions of the re-distribution lines.

3. The semiconductor package according to claim 2, wherein the exposed portions of the re-distribution lines comprise:
   portions of first re-distribution line parts of the re-distribution lines corresponding to an upper surface of the semiconductor chip; and
   portions of second re-distribution line parts of the re-distribution lines, corresponding to the upper surfaces of the side walls of the chip receiving body.

4. The semiconductor package according to claim 3, further comprising:
   connection members electrically connected with the exposed portions of corresponding first re-distribution line parts and corresponding second re-distribution line parts.

5. The semiconductor package according to claim 1, further comprising:
   an insulation layer having openings for exposing the bonding pads formed on the upper surface of the semiconductor chip.

6. The semiconductor package according to claim 5, wherein a total thickness of the bottom plate, the semiconductor chip, and the insulation layer is the substantially equal to a height of the side walls.

7. The semiconductor package according to claim 1, wherein two or more semiconductor chips are arranged on the bottom plate in the receiving space in the form of a matrix.

8. The semiconductor package according to claim 7, wherein corresponding bonding pads of the two or more semiconductor chips are electrically connected with each other by the re-distribution lines.

9. The semiconductor package according to claim 1, wherein two or more semiconductor chips are successively stacked on the bottom plate in the receiving space and the two or more semiconductor chips are electrically connected with each other by through-electrodes, and wherein the through-electrodes are electrically connected with corresponding re-distribution lines.

* * * * *